(12) United States Patent
Huang

(10) Patent No.: US 9,401,213 B1
(45) Date of Patent: Jul. 26, 2016

(54) NON-VOLATILE MEMORY APPARATUS AND OPERATION METHOD THEREOF

(71) Applicant: Winbond Electronics Corp., Taichung (TW)

(72) Inventor: Koying Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/941,654

(22) Filed: Nov. 15, 2015

(51) Int. Cl.
*G11C 16/10* (2006.01)
*G11C 16/24* (2006.01)
*G11C 16/08* (2006.01)

(52) U.S. Cl.
CPC ............... *G11C 16/10* (2013.01); *G11C 16/08* (2013.01); *G11C 16/24* (2013.01)

(58) Field of Classification Search
CPC .......... G11C 16/10; G11C 16/24; G11C 16/08
USPC ................................ 365/185.23, 227, 185.18
See application file for complete search history.

(56) References Cited

U.S. PATENT DOCUMENTS

| | | | | |
|---|---|---|---|---|
| 5,808,954 A * | 9/1998 | Ichikawa | ............. | G11C 11/418 327/535 |
| 7,656,710 B1 * | 2/2010 | Wong | ................. | G11C 11/5628 365/185.18 |
| 9,000,837 B1 * | 4/2015 | Fifield | ................. | G11C 29/021 327/306 |
| 9,156,647 B2 * | 10/2015 | Sauer | ................... | B65G 47/514 |
| 2003/0076701 A1 * | 4/2003 | Fetzer | ............... | G11C 11/4074 365/51 |
| 2004/0027108 A1 * | 2/2004 | Schreck | ..................... | G05F 1/46 323/282 |
| 2006/0091385 A1 * | 5/2006 | Mair | ..................... | H03F 1/0211 257/49 |
| 2007/0035985 A1 * | 2/2007 | Fifield | ................. | G11C 11/413 365/154 |
| 2009/0073752 A1 * | 3/2009 | Fackenthal | ............... | G11C 8/08 365/163 |
| 2013/0088909 A1 * | 4/2013 | Liu | ..................... | G11C 13/0038 365/148 |
| 2014/0241049 A1 * | 8/2014 | Vimercati | ............ | G11C 13/004 365/163 |

* cited by examiner

Primary Examiner — Viet Q Nguyen
(74) Attorney, Agent, or Firm — Jianq Chyun IP Office

(57) ABSTRACT

A NVM apparatus and an operation method thereof are provided. The NVM apparatus includes a NVM cell, a programming voltage generator, a WL-voltage generator and a CSL-voltage generator. A control terminal, and a first and second terminals of the NVM cell are electrically connected to a word line, a bit line and a common source line, respectively. The programming voltage generator provides a programming voltage to the bit line and detects a current thereof. The WL-voltage generator provides a WL-voltage to the word line, where a switch of the WL-voltage is a word line high voltage to a word line low voltage. The CSL-voltage generator provides a CSL-voltage to the common source line. According to the current of the bit line, the WL-voltage generator dynamical adjusts the word line low voltage, or the CSL-voltage generator dynamically adjusts the CSL-voltage.

12 Claims, 5 Drawing Sheets

NON-VOLATILE MEMORY APPARATUS AND OPERATION METHOD THEREOF

BACKGROUND OF THE INVENTION

1. Field of the Invention

The invention relates to a non-volatile memory, and particularly relates to a non-volatile memory apparatus and an operation method thereof.

2. Description of Related Art

FIG. 1 is a circuit schematic diagram of a flash memory. The flash memory shown in FIG. 1 includes a plurality of flash memory cells, for example, flash memory cells FC_1_1, . . . , FC_1_m, . . . , FC_n_1, . . . , FC_n_m shown in FIG. 1. Gates of the flash memory cells FC_I_1-FC_n_m are respectively coupled to one of a plurality of word lines WL_1, . . . , WL_m, drains of the flash memory cells FC_I_1-FC_n_m are respectively coupled to one of a plurality of bit lines BL_1, . . . , BL_n, and sources of the flash memory cells FC_1_1-FC_n_m are respectively coupled to a common source line CSL, as shown in FIG. 1.

A programming voltage generator circuit 110 provides a programming voltage $V_P$ to a column decoder 120 during a programming period. The column decoder 120 may selectively transmit the programming voltage $V_P$ to one of the bit lines BL_1-BL_n. A row decoder 130 may transmit different word line voltages to the word lines WL_1-WL_m through word line drivers 140_1, . . . , 140_m, so that the row decoder 130 and the word line drivers 140_1-140_m may selectively drive one of the word lines WL_1-WL_m. Based on an addressing operation of the column decoder 120 and the row decoder 130, any flash memory cell in the flash memory cells FC_1_1-FC_n_m can be programmed without influencing other flash memory cells.

A voltage switch (or voltage swing) of the word lines WL_I-WL_m is a word line high voltage to a ground voltage. When the voltage of one word line in the word lines WL_1-WL_m is the word line high voltage (i.e. the flash memory cells connected to one of the word lines are selected), the voltage of the other word lines in the word lines WL_1-WL_m is the ground voltage (i.e. the flash memory cells connected to the other word lines are not selected). In view of a single bit line (for example, the bit line BL_1, and the other bit lines can be deduced), when the programming voltage $V_P$ is applied to the bit line BL_1, a large amount of leakage current is leaked to the common source line CSL from the bit line BL_1 through the non-selected flash memory cells. The leakage current mainly comes from a sub-threshold current of the flash memory cells (transistors). The more the flash memory cells connected to the bit line BL_1 are, the larger the leakage current of the bit line BL_1 is. The large amount of leakage current may pull down a level of the programming voltage $V_P$ to cause an error of the programming operation performed to the flash memory cell.

SUMMARY OF THE INVENTION

The invention is directed to a non-volatile memory apparatus and an operation method thereof, by which a leakage current of a bit line is effectively decreased.

An embodiment of the invention provides a non-volatile memory apparatus including a non-volatile memory cell, a word line, a bit line, a common source line, a programming voltage generator circuit, a word line voltage (WL-voltage) generator circuit and a common source line voltage (CSL-voltage) generator circuit. The word line is electrically connected to a control terminal of the non-volatile memory cell. The bit line is electrically connected to a first terminal of the non-volatile memory cell. The common source line is electrically connected to a second terminal of the non-volatile memory cell. The programming voltage generator circuit is electrically connected to the bit line, and is configured to provide a programming voltage to the bit line during a programming period, and detect a current of the bit line. The WL-voltage generator circuit is electrically connected to the word line, and is configured to provide a WL-voltage to the word line during the programming period, where a switch (or voltage swing) of the WL-voltage is a word line high voltage to a word line low voltage. The CSL-voltage generator circuit is electrically connected to the common source line, and is configured to provide a CSL-voltage to the common source line during the programming period. The WL-voltage generator circuit is controlled by the programming voltage generator circuit for dynamically adjusting the word line low voltage according to the current of the bit line. Alternatively, the CSL-voltage generator circuit is controlled by the programming voltage generator circuit for dynamically adjusting the CSL-voltage according to the current of the bit line.

An embodiment of the invention provides an operation method of a non-volatile memory apparatus. The operation method includes following steps. A non-volatile memory cell is provided, where a control terminal of the non-volatile memory cell is electrically connected to a word line, a first terminal of the non-volatile memory cell is electrically connected to a bit line, and a second terminal of the non-volatile memory cell is electrically connected to a common source line. A programming voltage generator circuit provides a programming voltage to the bit line during a programming period, and a current of the bit line is detected. A WL-voltage generator circuit provides a WL-voltage to the word line during the programming period, where a switch (or voltage swing) of the WL-voltage is a word line high voltage to a word line low voltage. A CSL-voltage generator circuit provides a CSL-voltage to the common source line during the programming period. The WL-voltage generator circuit dynamically adjusts the word line low voltage according to the current of the bit line. Alternatively, the CSL-voltage generator circuit dynamically adjusts the CSL-voltage according to the current of the bit line.

According to the above description, the non-volatile memory apparatus and the operating method provided by the embodiments of the invention may detect the current of the bit line. The WL-voltage generator circuit dynamically adjusts the word line low voltage according to the current of the bit line, and/or the CSL-voltage generator circuit dynamically adjusts the CSL-voltage according to the current of the bit line, so as to pull down a "word line to common source line voltage difference" (i.e. the WL-voltage minus the CSL-voltage) of the non-selected non-volatile memory cell to a value lower than a sub-threshold of the non-volatile memory cell. Therefore, the non-volatile memory apparatus and the operation method thereof provided by the embodiments of the invention may effectively decrease a leakage current of the bit line.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings

DESCRIPTION OF EMBODIMENTS

Figure 1:
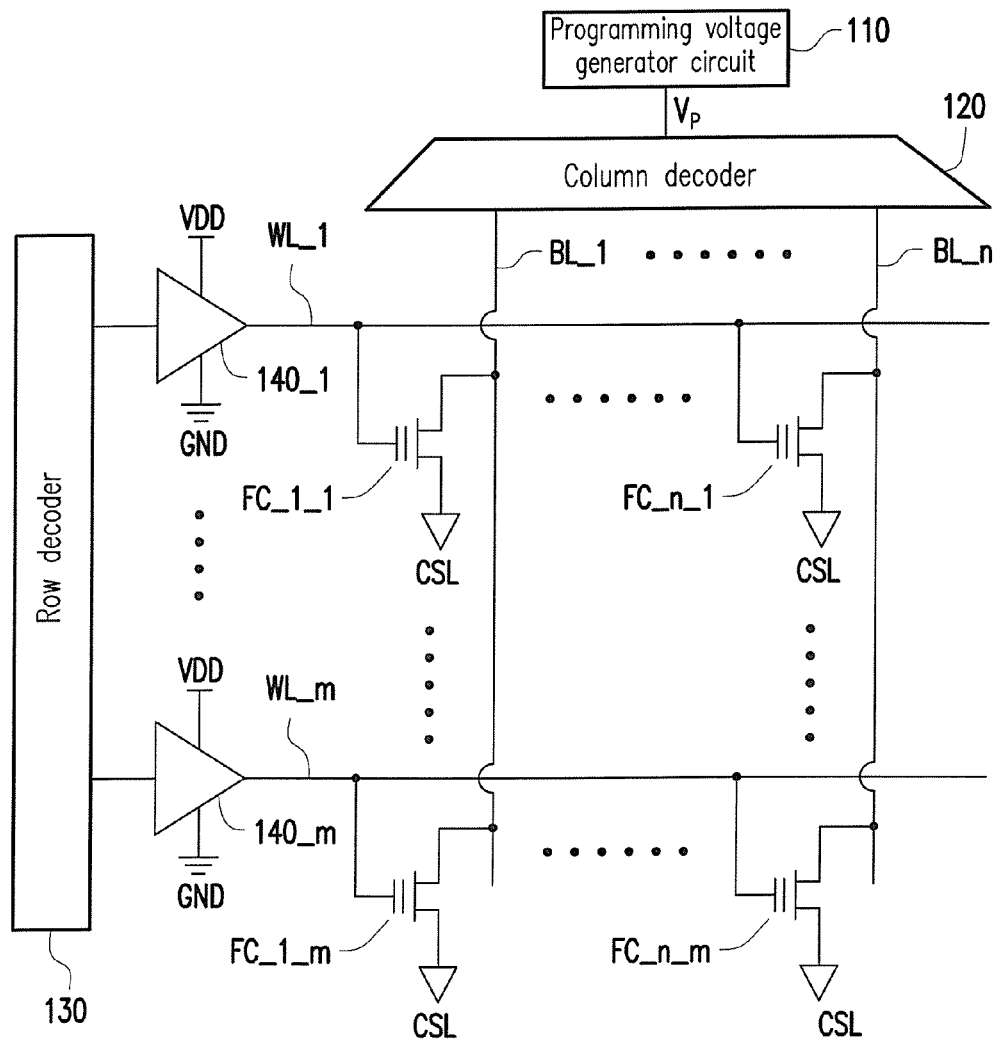
FIG. 1 is a circuit schematic diagram of a flash memory.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

Figure 2:
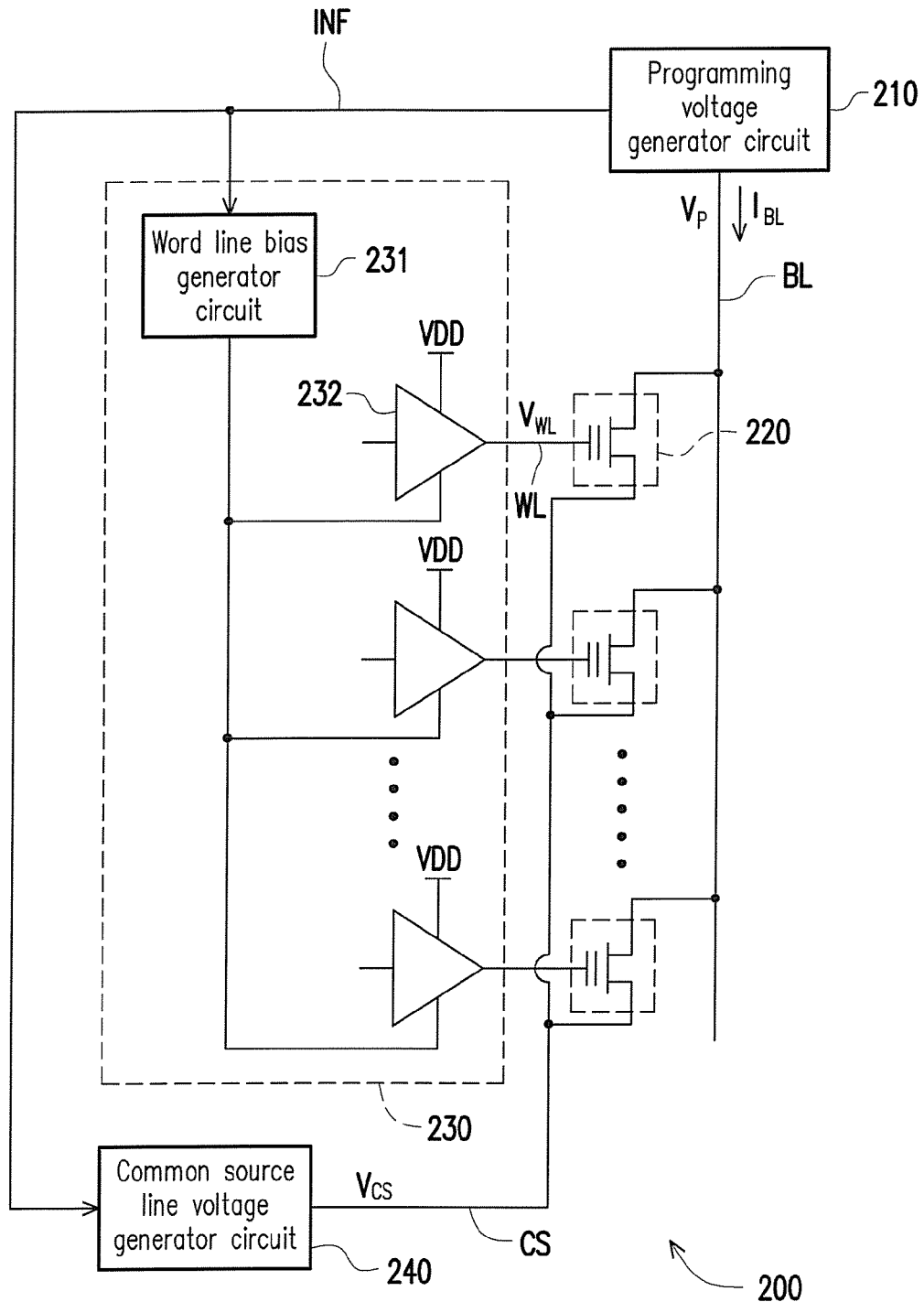
FIG. 2 is a circuit block diagram of a non-volatile memory (NVM) apparatus according to an embodiment of the invention.

FIG. 2 is a circuit block diagram of a non-volatile memory (NVM) apparatus 200 according to an embodiment of the invention. The related descriptions and instructions of the flash memory cells FC_1_1-FC_n_m, the word lines WL_1-WL_m, the bit lines BL_1-BL_n, the programming voltage generator circuit 110, the column detector 120, the row detector and the word line drivers 140_1-140_m of FIG. 1 can be used to deduce the NVM apparatus 200 of FIG. 2. Referring to FIG. 2, the NVM apparatus 200 includes a programming voltage generator circuit 210, a bit line BL, a NVM cell 220, a word line WL, a word line voltage (WL-voltage) generator circuit 230, a common source line CS and a common source line voltage (CSL-voltage) generator circuit 240.

According to a design requirement, the NVM cell 220 can be a NVM device/circuit of any type. For example, the NVM cell 220 can be a flash memory cell. A control terminal of the NVM cell 220 (for example, a gate of the flash memory cell) is electrically connected to the word line WL. A first terminal of the NVM cell 220 (for example, a drain of the flash memory cell) is electrically connected to the bit line BL. A second terminal of the NVM cell 220 (for example, a source of the flash memory cell) is electrically connected to the common source line CS. As shown in FIG. 2, the bit line BL is further electrically connected to other NVM cells, and description of the other NVM cells may refer to related description of the NVM cell 220, so that a detailed description thereof is not repeated.

The programming voltage generator circuit 210 is electrically connected to the bit line BL. The programming voltage generator circuit 210 may provide a programming voltage $V_p$ during a programming period, and detect a current $I_{BL}$ of the bit line BL. The programming voltage $V_p$ can be transmitted to the bit line BL through a column decoder (not shown). The WL-voltage generator circuit 230 is electrically connected to a plurality of word lines (for example, the word line WL). The WL-voltage generator circuit 230 may provide a WL-voltage $V_{WL}$ to the word line WL during the programming period, where a switch (or voltage swing) of the WL-voltage $V_{WL}$ is a word line high voltage to a word line low voltage. When the WL-voltage $V_{WL}$ of the word line WL is the word line high voltage, the NVM cell 220 connected to the word line WL is selected. When the WL-voltage $V_{WL}$ of the word line WL is the word line low voltage, the NVM cell 220 connected to the word line WL is not selected. When the word line WL is selected, the other word lines are not selected. The CSL-voltage generator circuit 240 is electrically connected to the common source line CS. The CSL-voltage generator circuit 240 may provide a CSL-voltage $V_{CS}$ to the common source line CS. When the NVM cell 220 is selected, and when the programming voltage $V_P$ is transmitted to the bit line BL, the NVM cell 220 can be programmed.

Figure 3:
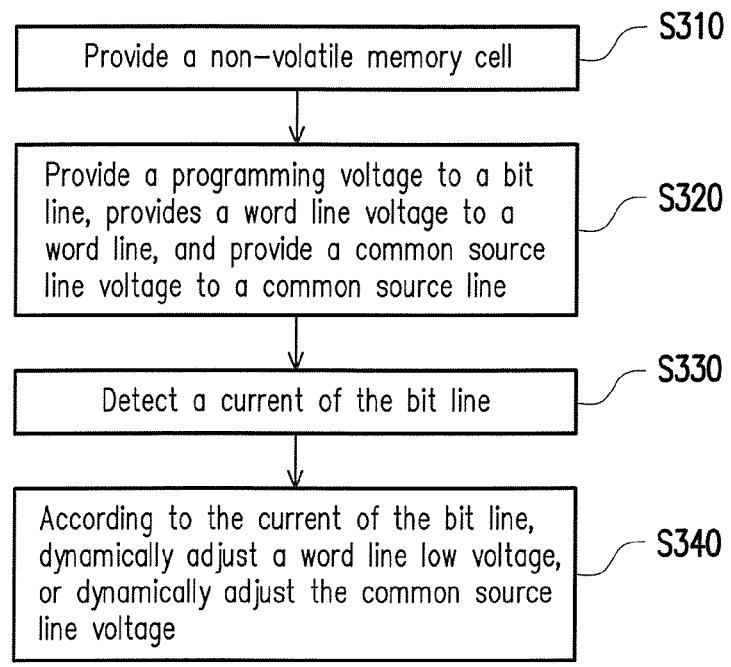
FIG. 3 is a flowchart illustrating an operation method of a NVM apparatus according to an embodiment of the invention.

FIG. 3 is a flowchart illustrating an operation method of the NVM apparatus 200 according to an embodiment of the invention. Referring to FIG. 2 and FIG. 3, in step S310, a NVM cell (for example, the NVM cell 220 or other NVM cell shown in FIG. 2) is provided. During the programming period, the programming voltage generator circuit 210 provides the programming voltage $V_P$ to a bit line (for example, the bit line BL or other bit line shown in FIG. 2), the WL-voltage generator circuit 230 provides the WL-voltage $V_{WL}$ to a word line (for example, the word line WL or other word line shown in FIG. 2), and the CSL-voltage generator circuit 240 provides the CSL-voltage $V_{CS}$ to the common source line CS (step S320). A switch (or voltage swing) of the WL-voltage $V_{WL}$ is the "word line high voltage" to the "word line low voltage". In step S330, the programming voltage generator circuit 210 detects the current $I_{BL}$ of the bit line BL, and provides current information INF corresponding to the current $I_{BL}$ to the WL-voltage generator circuit 230 and/or the CSL-voltage generator circuit 240.

The WL-voltage generator circuit 230 is controlled by the current information INF of the programming voltage generator circuit 210, and/or the CSL-voltage generator circuit 240 is controlled by the current information INF of the programming voltage generator circuit 210. In step S340, the WL-voltage generator circuit 230 dynamically adjusts the word line low voltage (i.e. a lower boundary of the switch of the WL-voltage $V_{WL}$) according to the current information INF corresponding to the current $I_{BL}$ of the bit line BL, and/or the CSL-voltage generator circuit 240 dynamically adjusts the CSL-voltage $V_{CS}$ according to the current information INF corresponding to the current $I_{BL}$ of the bit line BL, so as to pull down a "word line to common source line voltage difference" (i.e. the WL-voltage minus the CSL-voltage, for example, a gate source voltage of the flash memory cell) of the non-selected NVM cell to a value lower than a sub-threshold of the NVM cell. Therefore, the NVM apparatus of the present embodiment may effectively turn off the non-selected NVM cell, so as to decrease a leakage current of the bit line BL.

In some embodiments, the WL-voltage generator circuit 230 may correspondingly decrease the word line low voltage along with increase of the current $I_{BL}$ of the bit line BL, and/or the CSL-voltage generator circuit 240 may correspondingly increase the CSL-voltage $V_{CS}$ of the common source line CS along with increase of the current $I_{BL}$ of the bit line BL. For example, the WL-voltage generator circuit 230 may correspondingly adjust the word line low voltage from 0V to a negative voltage along with increase of the current $I_{BL}$ of the bit line BL, where a voltage value of the negative voltage corresponds to a current value of the current $I_{BL}$. Since the voltage value of the negative voltage corresponds to the current value of the current $I_{BL}$, a severe drain disturb caused by the excessively low negative voltage is avoided, and the severe drain disturb may influence the reliability of the NVM cell 220. For another example, the CSL-voltage generator circuit 240 may correspondingly adjust the CSL-voltage $V_{CS}$ of the common source line CS from 0V to a positive voltage along with increase of the current $I_{BL}$ of the bit line BL, where a voltage value of the positive voltage corresponds to the current value of the current $I_{BL}$. Since the voltage value of the positive voltage corresponds to the current value of the current $I_{BL}$, a severe decrease of a "bit line BL to common source line CS voltage difference" (for example, a drain source voltage $V_{ds}$ of the flash memory cell) caused by the excessively high positive voltage is avoided, and the severe decrease of the "bit line BL to common source line CS voltage difference" may influence a write efficiency of the NVM cell 220. Since the word line low voltage is correspondingly adjusted from 0V to the negative voltage along with increase of the current $I_{BL}$ of the bit line BL, and/or the CSL-voltage $V_{CS}$ of the common source line CS is correspondingly adjusted from 0V to the positive voltage along with increase of the current $I_{BL}$ of the bit line BL, the "word line WL to common source line CS voltage difference" of the non-selected NVM cell 220 (for example, a gate source voltage $V_{gs}$ of the flash memory cell) can be pulled down to a value lower than the sub-threshold of the NVM cell. Therefore, the non-selected NVM cell 220 can be effectively turned off, so as to decrease the leakage current of the bit line BL.

Figure 4:
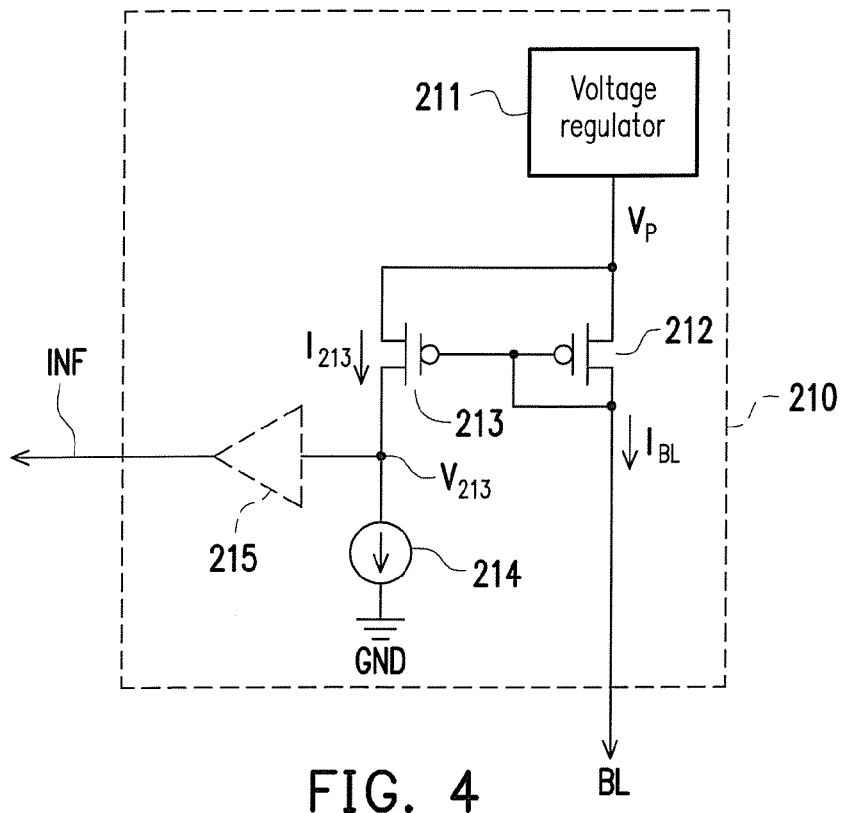
FIG. 4 is a circuit block diagram of a programming voltage generator circuit of FIG. 2 according to an embodiment of the invention.

FIG. 4 is a circuit block diagram of the programming voltage generator circuit 210 of FIG. 2 according to an embodiment of the invention. In the embodiment of FIG. 4, the programming voltage generator circuit 210 includes a voltage regulator 211, a first transistor 212, a second transistor 213, a constant current source 214 and a voltage detector 215. An output terminal of the voltage regulator 211 may provide the programming voltage VP during the programming period. A first terminal (for example, a source) of the first transistor 212 is electrically connected to the output terminal of the voltage regulator 211. A second terminal (for example, a drain) of the first transistor 212 is coupled to a control terminal (for example, a gate) of the first transistor 212 and the bit line BL. In some embodiments, similar to FIG. 1, the second terminal of the first transistor 212 can be coupled to the bit line BL through a column decoder (not shown). A first terminal (for example, a source) of the second transistor 213 is electrically connected to the output terminal of the voltage regulator 211. A control terminal (for example, a gate) of the second transistor 213 is coupled to the control terminal of the first transistor 212. The constant current source 214 is electrically connected to a second terminal (for example, a drain) of the second transistor 213.

The first transistor 212 and the second transistor 213 can be regarded as a current mirror. By setting a ratio between a channel width of the first transistor 212 and a channel width of a second transistor 213, a ratio between the current $I_{BL}$ flowing through the first transistor 212 and a current $I_{213}$ flowing through the second transistor 213 can be determined. A magnitude of the current $I_{213}$ may influence a magnitude of a voltage $V_{213}$. Therefore, the voltage $V_{213}$ has the current information corresponding to the current $I_{BL}$. An input terminal of the voltage detector 215 is electrically connected to the second terminal of the second transistor 213 for receiving the voltage $V_{213}$. An output terminal of the voltage detector 215 provides the current information INF corresponding to the current $I_{BL}$ to the WL-voltage generator circuit 230 and/or the CSL-voltage generator circuit 240. According to a design requirement, the voltage detector 215 can be a voltage comparator, an inverter, a voltage buffer or other voltage output circuit.

In other embodiments, the voltage detector 215 can be omitted. When the voltage detector 215 is omitted, the second terminal of the second transistor 213 can be coupled to the WL-voltage generator circuit 230 and/or the CSL-voltage generator circuit 240 for providing the current information INF corresponding to the current $I_{BL}$ implemented on the voltage $V_{213}$.

Figure 5:
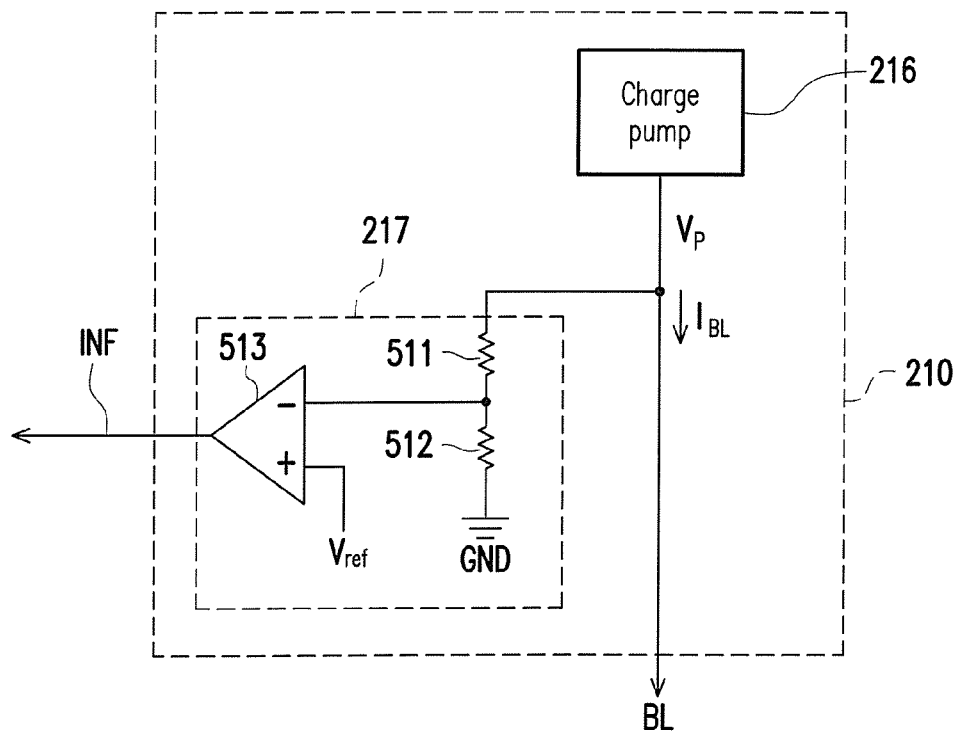
FIG. 5 is a circuit block diagram of the programming voltage generator circuit of FIG. 2 according to another embodiment of the invention.

FIG. 5 is a circuit block diagram of a programming voltage generator circuit 210 of FIG. 2 according to another embodiment of the invention. In the embodiment of FIG. 5, the programming voltage generator circuit 210 includes a charge pump 216 and a voltage detector 217. An output terminal of the charge pump 216 may provide the programming voltage $V_P$ to the bit line BL during the programming period. In some embodiments, similar to FIG. 1, the charge pump 216 may provide the programming voltage $V_P$ to the bit line BL through a column decoder (not shown). The current $I_{BL}$ of the bit line BL may pull down a level of the programming voltage $V_P$, so that the level of the programming voltage $V_P$ includes the current information corresponding to the current $I_{BL}$. An input terminal of the voltage detector 217 is electrically connected to the output terminal of the charge pump 216 for receiving the programming voltage $V_P$. An output terminal of the voltage detector 217 provides the current information INF corresponding to the current $I_{BL}$ of the bit line BL to the WL-voltage generator circuit 230 and/or the CSL-voltage generator circuit 240.

According to a design requirement, the voltage detector 217 can be a voltage comparator, an inverter, a voltage buffer or other voltage output circuit. In the embodiment of FIG. 5, the voltage detector 217 includes a first resistor 511, a second resistor 512 and a voltage comparator 513. A first terminal of the first resistor 511 is connected to the output terminal of the charge pump 216 for receiving the programming voltage $V_P$. A first terminal of the second resistor 512 is connected to a second terminal of the first resistor 511. A second terminal of the second resistor 512 is coupled to a first reference voltage (for example, a ground voltage GND). A first input terminal (for example, an inverted input terminal) of the voltage comparator 513 is electrically connected to the second terminal of the first resistor 511. A second input terminal (for example, a non-inverted input terminal) of the voltage comparator 513 is electrically connected to a second reference voltage Vref. A level of the second reference voltage Vref can be determined according to a design requirement. An output terminal of the voltage comparator 513 provides the current information INF corresponding to the current $I_{BL}$ to the WL-voltage generator circuit 230 and/or the CSL-voltage generator circuit 240.

Referring to FIG. 2, in the present embodiment, the WL-voltage generator circuit 230 includes a word line bias generator circuit 231 and word line drivers (for example, a word line driver 232). The word line drivers shown in FIG. 2 (for example, the word line driver 232) can be deduced according to related description of the word line drivers 140_1, . . . , 140_m of FIG. 1.

A control terminal of the word line bias generator circuit 231 is coupled to the programming voltage generator circuit 210 for receiving the current information INF corresponding to the current $I_{BL}$. The word line bias generator circuit 231 may generate and adjust the "word line low voltage" according to the current information INF. A power terminal of the word line driver 232 is supplied with the "word line high voltage" (for example, a system voltage VDD). A reference voltage terminal of the word line driver 232 is electrically connected to an output terminal of the word line bias generator circuit 231 for receiving the "word line low voltage". Therefore, the "word line high voltage" may define an upper boundary of the switch (or voltage swing) of the WL-voltage $V_{WL}$, and the "word line low voltage" may define the lower boundary of the switch (or voltage swing) of the WL-voltage $V_{WL}$. An output terminal of the word line driver 232 is electrically connected to the word line WL. As shown in FIG. 2, the word line bias generator circuit 231 is further electrically connected to other word line drivers, and description of the other word line drivers can be deduced according to the related description of the word line driver 232, and a detailed description thereof is not repeated.

In some embodiments, the word line bias generator circuit 231 may correspondingly decrease the "word line low voltage" according to the current information INF. For example, the word line bias generator circuit 231 may correspondingly adjust the word line low voltage from 0V to a negative voltage along with increase of the current $I_{BL}$ of the bit line BL, where a voltage value of the negative voltage corresponds to the current value of the current $I_{BL}$. Since the voltage value of the negative voltage corresponds to the current value of the current $I_{BL}$, a severe drain disturb caused by the excessively low negative voltage is avoided, and the severe drain disturb may influence the reliability of the NVM cell 220. Since the word line low voltage is correspondingly adjusted from 0V to the negative voltage along with increase of the current $I_{BL}$ of the bit line BL, the "word line WL to common source line CS voltage difference" of the non-selected NVM cell 220 (for example, the gate source voltage $V_{gs}$ of the flash memory cell) can be pulled down to a value lower than the sub-threshold of the NVM cell. Therefore, the non-selected NVM cell 220 can be effectively turned off, so as to decrease the leakage current of the bit line BL.

Figure 6:
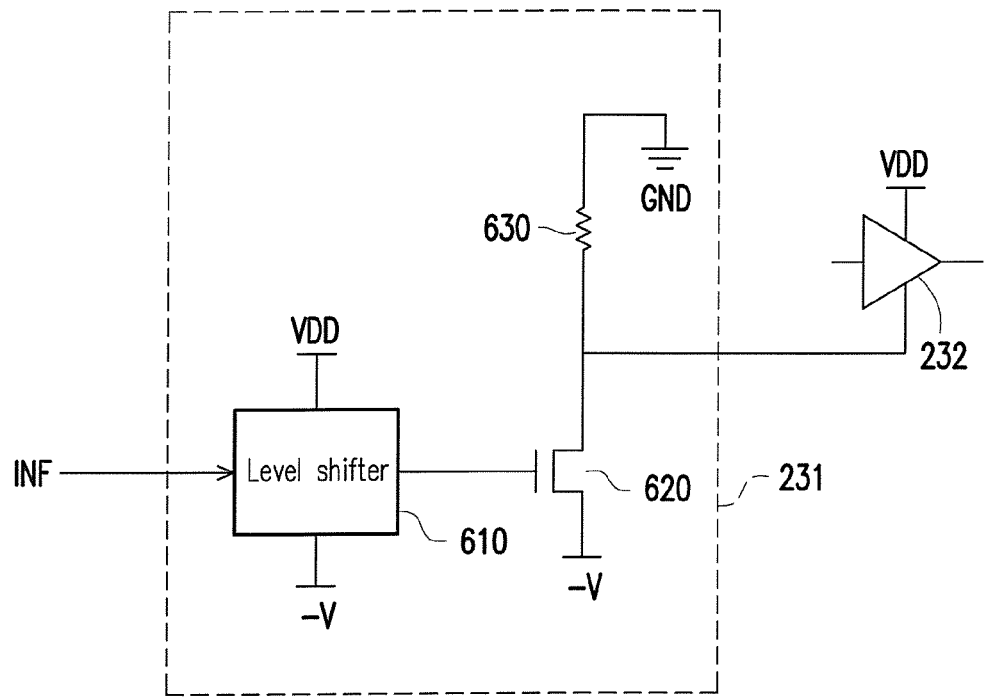
FIG. 6 is a circuit block diagram of a word line bias generator circuit of FIG. 2 according to an embodiment of the invention.

FIG. 6 is a circuit block diagram of the word line bias generator circuit 231 of FIG. 2 according to an embodiment of the invention. In the embodiment of FIG. 6, the word line bias generator circuit 231 includes a level shifter 610, a transistor 620 and a resistor 630. An input terminal of the level shifter 610 is coupled to the programming voltage generator circuit 210 for receiving the current information INF. A power terminal of the level shifter 610 is supplied with the system voltage VDD. A reference voltage terminal of the level shifter 610 is supplied with a negative reference voltage −V. A control terminal (for example, a gate) of the transistor 620 is electrically connected to an output terminal of the level shifter 610. A first terminal (for example, a source) of the transistor 620 is coupled to the negative reference voltage −V. A second terminal of the transistor 620 is coupled to the reference voltage terminal of the word line driver 232. A first terminal of the resistor 630 is coupled to the ground voltage GND. A second terminal of the resistor 630 is coupled to the second terminal of the transistor 620.

Figure 7:
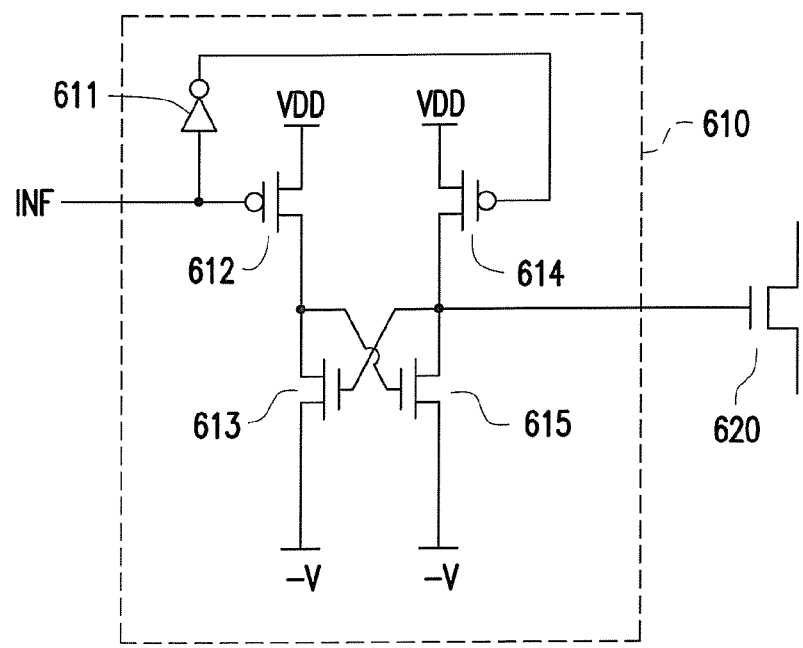
FIG. 7 is a circuit block diagram of a level shifter of FIG. 6 according to an embodiment of the invention.

According to a design requirement, the level shifter 610 can be any level shifting circuit. For example, FIG. 7 is a circuit block diagram of the level shifter 610 of FIG. 6 according to an embodiment of the invention. In the embodiment of FIG. 7, the level shifter 610 includes an inverter 611, a transistor 612, a transistor 613, a transistor 614 and a transistor 615. An input terminal of the inverter 611 is coupled to the programming voltage generator circuit 210 for receiving the current information INF. A control terminal (for example, a gate) of the transistor 612 is coupled to the programming voltage generator circuit 210 for receiving the current information INF. A first terminal (for example, a source) of the transistor 612 is coupled to the system voltage VDD. A first terminal (for example, a source) of the transistor 613 is coupled to the negative reference voltage −V. A second terminal (for example, a drain) of the transistor 613 is coupled to a second terminal (for example, a drain) of the transistor 612. A control terminal (for example, a gate) of the transistor 614 is coupled to an output terminal of the inverter 611. A first terminal (for example, a source) of the transistor 614 is coupled to the system voltage VDD. A second terminal (for example, a drain) of the transistor 614 is coupled to a control terminal (for example, a gate) of the transistor 613 and the control terminal of the transistor 620. A first terminal (for example, a source) of the transistor 615 is coupled to the negative reference voltage −V. A second terminal (for example, a drain) of the transistor 615 is coupled to the second terminal of the transistor 614. A control terminal (for example, a gate) of the transistor 615 is coupled to the second terminal of the transistor 612.

Figure 8:
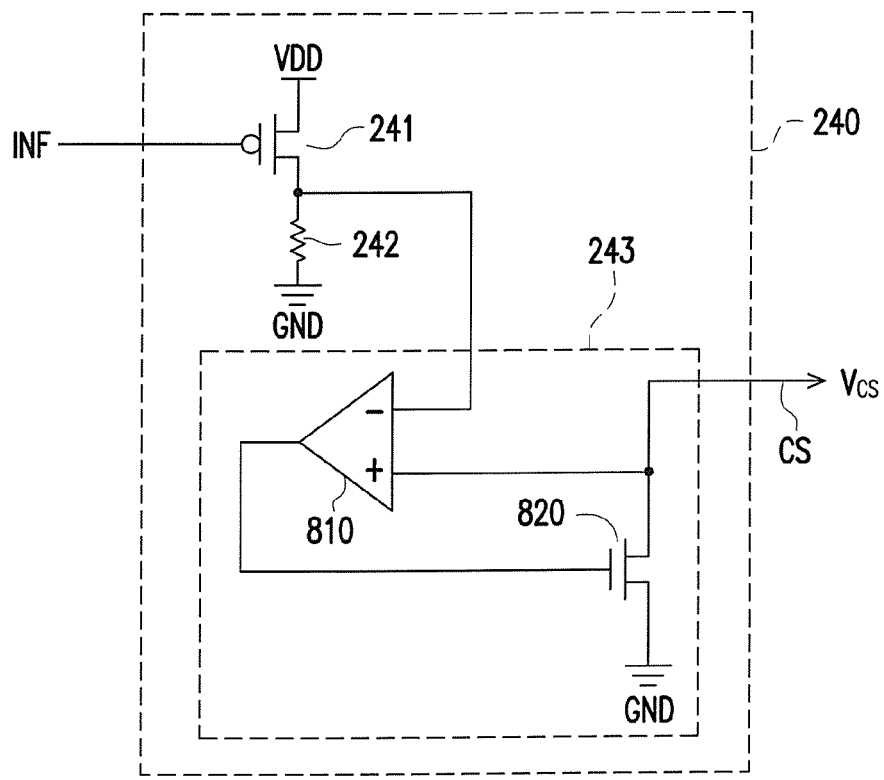
FIG. 8 is a circuit block diagram of a common source line voltage generator circuit of FIG. 2 according to an embodiment of the invention.

FIG. 8 is a circuit block diagram of a CSL-voltage generator circuit 240 of FIG. 2 according to an embodiment of the invention. In the embodiment of FIG. 8, the CSL-voltage generator circuit 240 includes a first transistor 241, a resistor 242 and a voltage follower 243. A control terminal (for example, a gate) of the first transistor 241 is electrically connected to the programming voltage generator circuit 210 for receiving the current information INF corresponding to the current $I_{BL}$. A first terminal (for example, a source) of the first transistor 241 is coupled to the system voltage VDD. A first terminal of the resistor 242 is coupled to a second terminal (for example, a drain) of the first transistor 241. A second terminal of the resistor 242 is coupled to the ground voltage GND. An input terminal of the voltage follower 243 is coupled to the second terminal of the first transistor 241. An output terminal of the voltage follower 243 is coupled to the common source line CS for providing the CSL-voltage $V_{CS}$.

According to a design requirement, the voltage follower 243 can be any voltage conversion circuit. For example, in the embodiment of FIG. 8, the voltage follower 243 includes an operational amplifier 810 and a second transistor 820. A first input terminal (for example, an inverted input terminal) of the operational amplifier 810 is coupled to the second terminal of the first transistor 241. A control terminal (for example, a gate) of the second transistor 820 is electrically connected to an output terminal of the operational amplifier 810. A first terminal (for example, a source) of the second transistor 820 is coupled to the ground voltage GND. A second terminal (for example, a drain) of the second transistor 820 is coupled to a second input terminal (for example, a non-inverted input terminal) of the operational amplifier 810 and the common source line CS.

It should be noted that in different application situations, related functions of the WL-voltage generator circuit 230 and/or the CSL-voltage generator circuit 240 can be implemented as firmware or hardware by using general hardware description languages, for example, Verilog HDL or VHDL or other suitable programming languages. The firmware capable of executing the aforementioned related functions can be implemented in any known computer-accessible medias such as magnetic tapes, semiconductor memories, magnetic disks or compact disks (for example, CD-ROM or DVD-ROM), or the firmware can be transmitted through the Internet, wired communication, wireless communication or other communication media. The firmware can be stored in the computer-accessible medias to facilitate a processor of a computer to access/execute programming codes of the firmware. Moreover, the apparatus and the method of the invention can be implemented through a combination of hardware and software.

In summary, the non-volatile memory apparatus 200 and the operating method thereof provided by the embodiments of the invention may detect the current $I_{BL}$ of the bit line BL. The WL-voltage generator circuit 230 may dynamically adjust the word line low voltage according to the current $I_{BL}$ of the bit line BL, and/or the CSL-voltage generator circuit 240 may dynamically adjust the CSL-voltage $V_{CS}$ according to the current $I_{BL}$ of the bit line BL, so as to pull down the "word line WL to common source line CS voltage difference" (i.e. $V_{WL}$-$V_{CS}$) of the non-selected NVM cell 220 to a value lower than a sub-threshold of the NVM cell. Therefore, the NVM apparatus 200 and the operation method thereof may effectively decrease the leakage current of the bit line BL.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile memory apparatus, comprising:
   a non-volatile memory cell;
   a word line, electrically connected to a control terminal of the non-volatile memory cell;
   a bit line, electrically connected to a first terminal of the non-volatile memory cell;
   a common source line, electrically connected to a second terminal of the non-volatile memory cell;
   a programming voltage generator circuit, electrically connected to the bit line, configured to provide a programming voltage to the bit line during a programming period, and detecting a current of the bit line;
   a word line voltage generator circuit, electrically connected to the word line, and configured to provide a word line voltage to the word line during the programming period, wherein a switch of the word line voltage is a word line high voltage to a word line low voltage; and
   a common source line voltage generator circuit, electrically connected to the common source line, and configured to provide a common source line voltage to the common source line during the programming period,
   wherein the word line voltage generator circuit is controlled by the programming voltage generator circuit for dynamically adjusting the word line low voltage according to the current of the bit line, or the common source line voltage generator circuit is controlled by the programming voltage generator circuit for dynamically adjusting the common source line voltage according to the current of the bit line.

2. The non-volatile memory apparatus as claimed in claim 1, wherein along with increase of the current of the bit line, the word line voltage generator circuit correspondingly decreases the word line low voltage, or the common source line voltage generator circuit correspondingly increases the common source line voltage.

3. The non-volatile memory apparatus as claimed in claim 1, wherein the programming voltage generator circuit comprises:
   a voltage regulator, having an output terminal, and configured to provide the programming voltage during the programming period;
   a first transistor, having a first terminal electrically connected to the output terminal of the voltage regulator, and a second terminal coupled to a control terminal of the first transistor and the bit line;
   a second transistor, having a first terminal electrically connected to the output terminal of the voltage regulator, a second terminal coupled to the word line voltage generator circuit or the common source line voltage generator circuit for providing current information corresponding to the current of the bit line, and a control terminal coupled to the control terminal of the first transistor; and
   a constant current source, electrically connected to the second terminal of the second transistor.

4. The non-volatile memory apparatus as claimed in claim 1, wherein the programming voltage generator circuit comprises:
   a voltage regulator, having an output terminal, and configured to provide the programming voltage during the programming period;
   a first transistor, having a first terminal electrically connected to the output terminal of the voltage regulator, and a second terminal coupled to a control terminal of the first transistor and the bit line;
   a second transistor, having a first terminal electrically connected to the output terminal of the voltage regulator, and a control terminal coupled to the control terminal of the first transistor;
   a constant current source, electrically connected to a second terminal of the second transistor; and
   a voltage detector, having an input terminal electrically connected to the second terminal of the second transistor, and an output terminal providing current information corresponding to the current of the bit line to the word line voltage generator circuit or the common source line voltage generator circuit.

5. The non-volatile memory apparatus as claimed in claim 1, wherein the programming voltage generator circuit comprises:
   a charge pump, having an output terminal, and configured to provide the programming voltage to the bit line during the programming period; and
   a voltage detector, having an input terminal electrically connected to the output terminal of the charge pump, and an output terminal providing current information corresponding to the current of the bit line to the word line voltage generator circuit or the common source line voltage generator circuit.

6. The non-volatile memory apparatus as claimed in claim 5, wherein the voltage detector comprises:
   a first resistor, having a first terminal electrically connected to the output terminal of the charge pump;
   a second resistor, having a first terminal electrically connected to a second terminal of the first resistor, and a second terminal coupled to a first reference voltage; and
   a voltage comparator, having a first input terminal electrically connected to the second terminal of the first resistor, a second input terminal electrically connected to a second reference voltage, and an output terminal providing the current information to the word line voltage generator circuit or the common source line voltage generator circuit.

7. The non-volatile memory apparatus as claimed in claim 1, wherein the word line voltage generator circuit comprises:
   a word line bias generator circuit, having a control terminal coupled to the programming voltage generator circuit for receiving current information corresponding to the current of the bit line, and configured to correspondingly generate and adjust the word line low voltage according to the current information; and a word line driver, having a power terminal supplied with the word line high voltage, a reference voltage terminal electrically connected to an output terminal of the word line bias generator circuit for receiving the word line low voltage, and an output terminal electrically connected to the word line.

8. The non-volatile memory apparatus as claimed in claim 7, wherein the word line bias generator circuit comprises:
  a level shifter, having an input terminal coupled to the programming voltage generator circuit for receiving the current information;
  a transistor, having a control terminal electrically connected to an output terminal of the level shifter, a first terminal coupled to a negative reference voltage, and a second terminal coupled to the reference voltage terminal of the word line driver; and
  a resistor, having a first terminal coupled to a ground voltage, and a second terminal coupled to the second terminal of the transistor.

9. The non-volatile memory apparatus as claimed in claim 1, wherein the common source line voltage generator circuit comprises:
  a first transistor, having a control terminal electrically connected to the programming voltage generator circuit for receiving current information corresponding to the current of the bit line, and a first terminal coupled to a system voltage;
  a resistor, having a first terminal coupled to a second terminal of the first transistor, and a second terminal coupled to a ground voltage; and
  a voltage follower, having an input terminal coupled to the second terminal of the first transistor, and an output terminal coupled to the common source line for providing the common source line voltage.

10. The non-volatile memory apparatus as claimed in claim 9, wherein the voltage follower comprises:
  an operational amplifier, having a first input terminal coupled to the second terminal of the first transistor; and
  a second transistor, having a control terminal electrically connected to an output terminal of the operational amplifier, a first terminal coupled to the ground voltage, and a second terminal coupled to a second input terminal of the operational amplifier and the common source line.

11. An operation method of a non-volatile memory apparatus, comprising:
  providing a non-volatile memory cell, wherein a control terminal of the non-volatile memory cell is electrically connected to a word line, a first terminal of the non-volatile memory cell is electrically connected to a bit line, and a second terminal of the non-volatile memory cell is electrically connected to a common source line;
  providing a programming voltage to the bit line by a programming voltage generator circuit during a programming period, and detecting a current of the bit line;
  providing a word line voltage to the word line by a word line voltage generator circuit during the programming period, wherein a switch of the word line voltage is a word line high voltage to a word line low voltage;
  providing a common source line voltage to the common source line by a common source line voltage generator circuit during the programming period; and
  dynamically adjusting the word line low voltage by the word line voltage generator circuit according to the current of the bit line, or dynamically adjusting the common source line voltage by the common source line voltage generator circuit according to the current of the bit line.

12. The operation method of the non-volatile memory apparatus as claimed in claim 11, wherein the word line voltage generator circuit correspondingly decreases the word line low voltage along with increase of the current of the bit line, or the common source line voltage generator circuit correspondingly increases the common source line voltage along with increase of the current of the bit line.

* * * * *